US005525374A

United States Patent [19]
Ritland et al.

[11] Patent Number: 5,525,374
[45] Date of Patent: Jun. 11, 1996

[54] METHOD FOR MAKING CERAMIC-METAL GRADIENT COMPOSITES

[75] Inventors: Marcus A. Ritland, Golden; Dennis W. Readey, Lakewood; Jack D. Sibold, Golden; Dean A. Rulis, Littleton, all of Colo.

[73] Assignee: Golden Technologies Company, Golden, Colo.

[21] Appl. No.: 220,559

[22] Filed: Mar. 31, 1994

Related U.S. Application Data

[63] Continuation of Ser. No. 946,972, Sep. 17, 1992, abandoned.
[51] Int. Cl.⁶ .................................................... B05D 3/02
[52] U.S. Cl. ........................ 427/376.1; 427/383.5; 427/431; 427/443.2
[58] Field of Search ............................ 427/376.1, 383.5, 427/431, 443.2

[56] References Cited

U.S. PATENT DOCUMENTS

| | | | |
|---|---|---|---|
| 2,612,443 | 9/1952 | Goetzel et al. | 75/22 |
| 3,310,427 | 3/1967 | Cheney et al. | 117/113 |
| 3,864,154 | 2/1975 | Gazza et al. | 29/123 B |
| 3,868,267 | 2/1975 | Gazzo et al. | 264/60 |
| 3,928,662 | 12/1975 | Kaneko et al. | 427/294 |
| 3,949,804 | 4/1976 | Kaneko et al. | 164/62 |
| 4,108,672 | 8/1978 | Klug et al. | 106/38.9 |
| 4,164,424 | 8/1979 | Klug et al. | 106/38.9 |
| 4,404,262 | 9/1983 | Watmough | 428/539.5 |
| 4,588,551 | 5/1986 | Iijimo et al. | 410/2 |
| 4,824,622 | 4/1989 | Kennedy et al. | 264/59 |
| 4,828,008 | 5/1989 | White et al. | 164/66.1 |
| 4,853,352 | 8/1989 | Newkirk et al. | 501/88 |
| 4,868,143 | 9/1989 | Newkirk et al. | 501/127 |
| 4,882,306 | 11/1989 | Kennedy et al. | 501/87 |
| 4,988,645 | 1/1991 | Holt et al. | 501/91 |
| 5,000,246 | 3/1991 | Dwivedi et al. | 164/97 |
| 5,004,035 | 4/1991 | Burke et al. | 164/97 |
| 5,005,631 | 4/1991 | Dwivedi | 164/97 |
| 5,007,475 | 4/1991 | Kennedy et al. | 164/97 |
| 5,016,703 | 5/1991 | Aghajanian et al. | 164/97 |
| 5,017,533 | 5/1991 | Newkirk et al. | 501/127 |
| 5,164,347 | 11/1992 | Kennedy et al. | 501/127 |
| 5,266,537 | 11/1993 | Kennedy et al. | 501/127 |
| 5,267,601 | 12/1993 | Dwivedi | 164/97 |

OTHER PUBLICATIONS

"Performance Characteristics Of Metal-Ceramic Composites Made By The Squeeze Casting Process", Suresh K. Verma and John L. Dorcic, IIT Research Institute, Chicago, Ceram. Eng. Sci. Proc., 9[7–8] pp. 579–596 (1988).

"Modeling Of Infiltration Kinetics For Liquid Metal Processing Of Composites", G. P. Martins, D. L. Olson, and G. R. Edwards, Metallurgical Transactions B, vol. 19B, Feb. 1988, pp. 95–101.

Primary Examiner—Benjamin Utech
Attorney, Agent, or Firm—Sheridan Ross & McIntosh

[57] ABSTRACT

A process for fabricating ceramic-metal composites having ceramic and metal phases wherein the ceramic to metal ratio changes within the ceramic. The process includes the steps of contacting a porous ceramic matrix material with a molten metal whereby capillary action pulls the metal into the ceramic matrix to substantially fill the void space. The ceramic matrix has a porosity gradient wherein the infiltrated composite has a varying ratio of ceramic to metal.

11 Claims, 2 Drawing Sheets

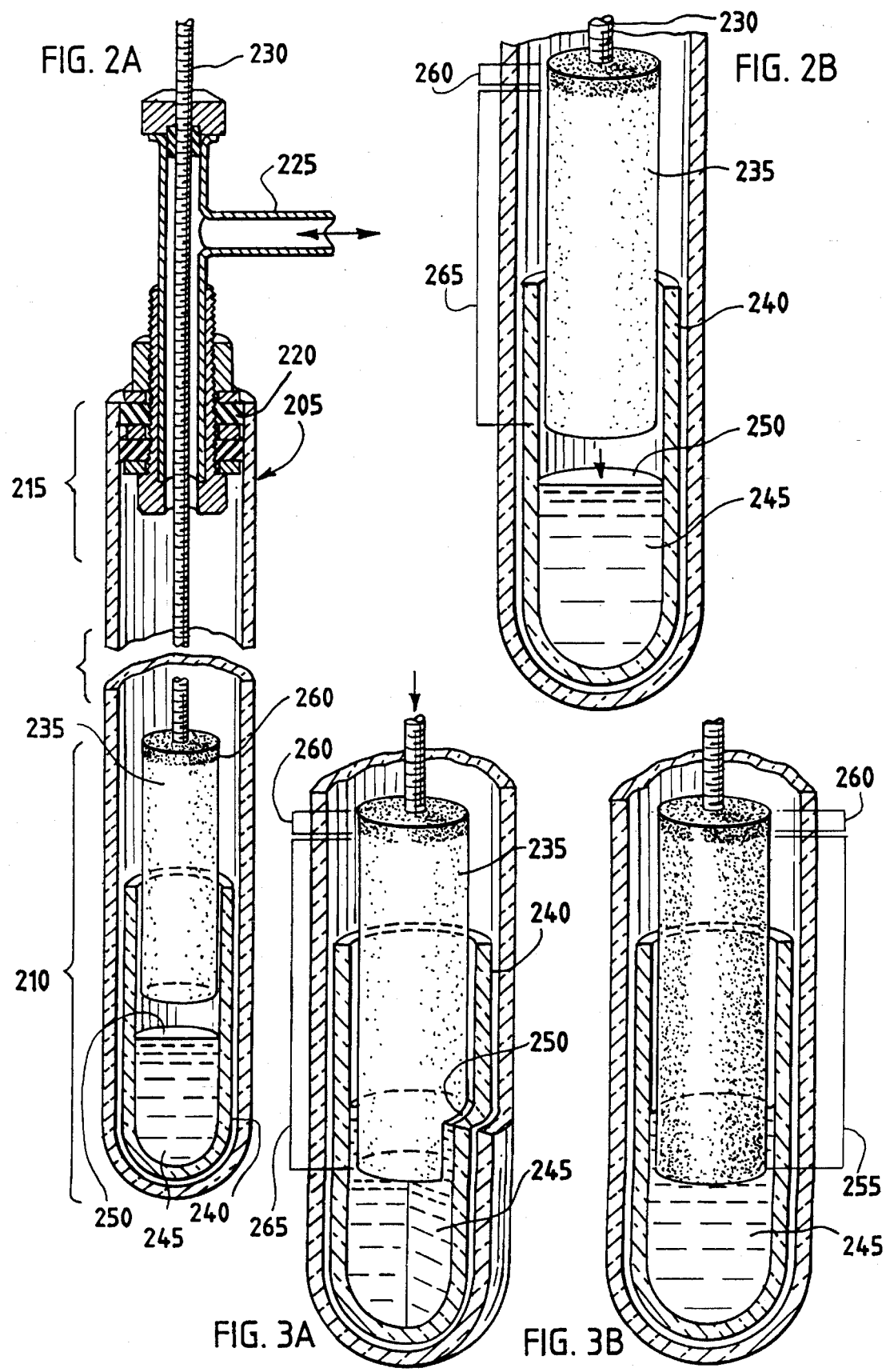

METHOD FOR MAKING CERAMIC-METAL GRADIENT COMPOSITES

This application is a continuation-in-part of U.S. patent application Ser. No. 07/946,972, filed Sep. 17, 1992, now abandoned.

BACKGROUND OF THE INVENTION

1. Field of the Invention

The present invention relates to ceramic-metal composite materials, or cermets, and methods of producing such composites. More particularly, the present invention relates to ceramic-metal composites having graded properties resulting from a change in the ratio of ceramic to metal in the material and the methods for producing such composites.

2. Description of Related Art

During the last few decades, ceramics have been investigated for use in many structural applications, particularly in high temperature environments. However, ceramic materials are not always well suited since they are brittle, have a limited ductility and low values of fracture toughness at low temperatures. In addition, the fracture strength of ceramics is not very reproducible since the average strength usually varies from one lot of parts to the next, which is attributed to the presence of processing flaws which can initiate fractures. A great deal of effort has been expended in an attempt to increase the fracture reliability of ceramic materials and to develop tough and creep-resistant ceramic composites.

One possible solution is the fabrication of a ceramic-metal composite, also commonly referred to as a cermet. Traditionally, ceramic-metal composites have been produced in one of two ways; (1) by heating mixtures of ceramic and metal materials to obtain a metal matrix having a discrete ceramic phase, or (2) as disclosed in U.S. Pat. No. 2,612,443 by Goetzel at al., issued Sep. 30, 1952, by forming a sintered porous body that can be a metal, metal-carbide or metal-nitride, and infiltrating the porous body with a molten metal by the use of mechanical squeeze-casting or other means of applying pressure to force the molten metal into the voids within the porous body.

Other approaches for forming cermets have been used due to a lack of success in obtaining adequate control of cermet composition and form with traditional processes. For example, use of accelerated oxidation reactions and "combustion wave" exothermic reaction processes have been utilized to form cermets. See, for example, U.S. Pat. No. 4,988,645 by Holt et al., issued Jan. 29, 1991.

The LANXIDE process, such as that disclosed in U.S. Pat. No. 4,853,352 by Newkirk et al., issued Aug. 1, 1989, relates to a method for forming cermets whereby a molten parent metal is oxidized, usually in the presence of oxidation enhancing dopants, to create a three-dimensional interconnected ceramic-metal composite material which contains between 1% and 40% of the parent metal by volume. This process is limited in that only the parent metal is infiltrated into the oxide reaction product and the process takes extended periods of time, such as 48 hours or more.

Infiltration of molten metals into porous ceramic preforms by squeeze casting and by applying pressure to the molten metal is known, for example, see Verma and Dorcic, "Performance Characteristics of Metal-Ceramic Composites Made by the Squeeze Casting Process", *Ceramic Engineering Science Proc.*, Vol. 9, pp. 579–596 (1988). However, it is difficult to achieve near complete infiltration of the void space within the preforms without use of substantial pressure. In addition, when ceramic preform materials contain a high volume of porosity, the use of pressure in squeeze casting techniques can crumble the ceramic structure. The use of pressure can also preclude the formation of ceramic-metal composites having complex shapes. Further, these processes require complex pressure dies and frequently require extensive flash removal, that is, removal of excess metal.

Infiltration using vacuum furnaces and using infiltration enhancers are also described in the art. U.S. Pat. No. 3,864,154 by Gazza et al., issued Feb. 4, 1975, discloses a method for the infiltration of aluminum or silicon into a cold-pressed compact of boron-containing ceramics (e.g., aluminum boride or silicon boride) in a vacuum furnace. It is disclosed that the infiltration process takes about 2 hours.

U.S. Pat. No. 4,828,008 by White et al. issued on May 9, 1989. White et al. disclose a method for infiltrating aluminum alloys into a permeable mass of loose ceramic powder, such as alumina. A nitrogen gas atmosphere must be used and magnesium must be alloyed into the aluminum metal to achieve spontaneous infiltration. U.S. Pat. No. 5,016,703 by Aghajanian et al. and issued on May 21, 1991, discloses a process for the spontaneous infiltration of aluminum into a ceramic preform that comprises a mass of particles, platelets, whiskers or fibers. An infiltration enhancer, such as magnesium turnings, is placed between the molten metal and the preform to enhance the infiltration. The infiltration time is on the order of about 5 hours.

U.S. Pat. No. 5,004,035 by Burke et al. issued Apr. 2, 1991, discloses the use of infiltration enhancers for infiltrating aluminum alloys into alumina or silicon carbide preforms that comprise loose particles of materials such as alumina or silicon carbide. After infiltration, which can take on the order of about 10 hours, the metal composite can be reheated and worked to vary the properties of the composite.

U.S. Pat. No. 5,017,533 by Newkirk et al. issued on May 21, 1991. Newkirk et al. disclose a method for producing a self-supporting ceramic body by oxidation of a molten precursor metal with a vapor-phase oxidant to form an oxidation reaction product. A second metal is incorporated into the molten flux during the oxidation reaction. For example, copper can be alloyed into aluminum which is then oxidized to form an alumina oxidation product. The oxidation process takes on the order of 48 hours or more.

U.S. Pat. No. 5,007,475 by Kennedy et al. issued on Apr. 16, 1991. Kennedy et al. disclose the formation of a metal matrix composite body by the spontaneous infiltration of a molten matrix metal into a three-dimensional interconnected material. The metal is an aluminum alloy and the three-dimensional matrix is preferably alumina. The aluminum alloy is placed on top of the three-dimensional interconnected material and the assembly is placed in a containing vessel, which is then heated to infiltrate the metal into the three-dimensionally interconnected material. The typical infiltration time is on the order of about 7 hours or more.

U.S. Pat. No. 4,868,143 by Newkirk et al. and issued on Sep. 19, 1989, discloses a process for making a composite wherein an oxidation reaction product (e.g., alumina) is formed with aluminum parent-metal interconnected therethrough. The composite is then contacted with a second molten metal such as copper or nickel which infiltrates the interconnected parent metal by interdiffusion. The resulting product is a composite having a mixture of two metals interconnected throughout the composite.

U.S. Pat. No. 5,267,601 by Dwivedi, issued on Dec. 7, 1993, discloses a process wherein a permeable mass is formed into a preform having a cavity. The preform containing the cavity is placed at least partially into the molten matrix metal such that an infiltrating atmosphere can communicate with the cavity in order to obtain spontaneous infiltration of the molten matrix metal. Extended periods of time (e.g., 25 to 100 hours) are used to complete infiltration and the preform is only infiltrated to the level that the preform is immersed in the molten metal.

Composites having graded properties have also been suggested in the prior art. For example, see U.S. Pat. No. 3,868,267 by Gazza et al., which issued on Feb. 25, 1975. Gazza et al. disclose a method for the fabrication of a ceramic-metal composite material having a combination of different properties, preferably formed using a gradient system consisting of a transition from a hard, non-ductile front surface to a tough and ductile rear surface. In one embodiment, an $AlB_{12}$ powder compact was fabricated wherein one end of the compact had an average particle size greater than the other end of the compact. One end was infiltrated with silicon metal while the other end was infiltrated with aluminum metal. According to another embodiment, one part of a monolithic ceramic compact to be infiltrated includes a ceramic that is wet by a liquid metal and hence is infiltrated by the liquid metal while the other part of the compact consists of a different ceramic that is not wet by the same liquid metal infiltrant and hence is not infiltrated.

U.S. Pat. No. 4,404,262 by Watmough issued on Sep. 13, 1983. Watmough discloses a composite metallic and refractory article in which a metallic layer is partially absorbed within a refractory layer, such a ceramic layer. The density of the refractory ceramic layer increases as it extends away from the metallic layer. It is disclosed that the composite is formed by forcing a molten metal under pressure into the porous structure of the refractory layer.

U.S. Pat. Nos. 4,882,306, 5,164,347, and 5,266,537, all by Kennedy et al., disclose methods for producing a ceramic or ceramic composite body with graded properties. The ceramic is formed by oxidation of a parent metal and the graded properties are obtained by altering the process conditions during the formation of the body by the oxidation reaction. In an embodiment of the invention, it is disclosed that a ceramic matrix was formed from aluminum comprising a zone of alumina and a zone of aluminum nitride by altering the growth atmosphere.

There exists a need for a simple and relatively efficient method for fabricating ceramic-metal composites having graded properties. It would be particularly advantageous if such ceramic-metal composites could be formed using a process that is relatively fast and produces substantially dense and non-porous gradient composites that include substantially continuous metal and ceramic phases, wherein the ratio of metal to ceramic in the article varies through the article.

SUMMARY OF THE INVENTION

The present invention is generally directed to a method for forming a ceramic-metal composite having graded properties and the composites produced thereby.

According to one aspect of the present invention, a method for making a ceramic-metal composite having graded properties is provided. The process can include the steps of forming a sintered ceramic body having at least two portions wherein at least one of the portions comprises ceramic having open porosity that is substantially different than the open porosity in another portion of the ceramic body, placing a metal in a refractory vessel adapted to contain the metal in a molten state, heating the metal to a temperature in excess of the melting temperature of the metal to form a molten pool having a top surface, contacting a portion of the sintered ceramic body with the heated metal to infiltrate the metal into the ceramic, and cooling the infiltrated ceramic to form a ceramic-metal composite.

According to certain embodiments of this aspect of the invention, at least a portion of the composite comprises substantially fully dense ceramic. According to another embodiment, the ceramic consists essentially of alumina and the metal consists essentially of copper. In a further embodiment, the at least two portions include a porosity gradient in the sintered ceramic body wherein the porosity gradient changes gradually from one end to the other.

According to another aspect of the present invention, a method for making an article having a ceramic-metal composite portion integrally connected to a dense ceramic portion is provided. The method can include the steps of forming a sintered ceramic body having at least a top portion consisting essentially of dense ceramic and a bottom portion including a ceramic matrix having at least about 5 volume percent open porosity, placing an infiltrant metal into a refractory vessel adapted to contain the metal at high temperatures, heating the metal to a temperature in excess of the melting temperature of the metal such that the metal is in the form of a molten pool having a top surface, contacting the bottom portion of the ceramic body with the top surface of the molten pool for a time sufficient to infiltrate a portion of the sintered ceramic body, removing the sintered ceramic body from contact with the molten pool, and cooling the ceramic to form an article having a ceramic-metal composite portion integrally connected to a dense ceramic portion.

According to one embodiment of this aspect of the invention, the bottom portion includes from about 10 volume percent to about 90 volume percent open porosity.

BRIEF DESCRIPTION OF THE DRAWINGS

FIGS. 2A and 2B illustrate an apparatus useful for carrying out a method according to one embodiment of the present invention.

FIGS. 3A and 3B illustrate an apparatus useful for carrying out a method according to one embodiment of the present invention.

DESCRIPTION OF PREFERRED EMBODIMENTS

Figure 1:
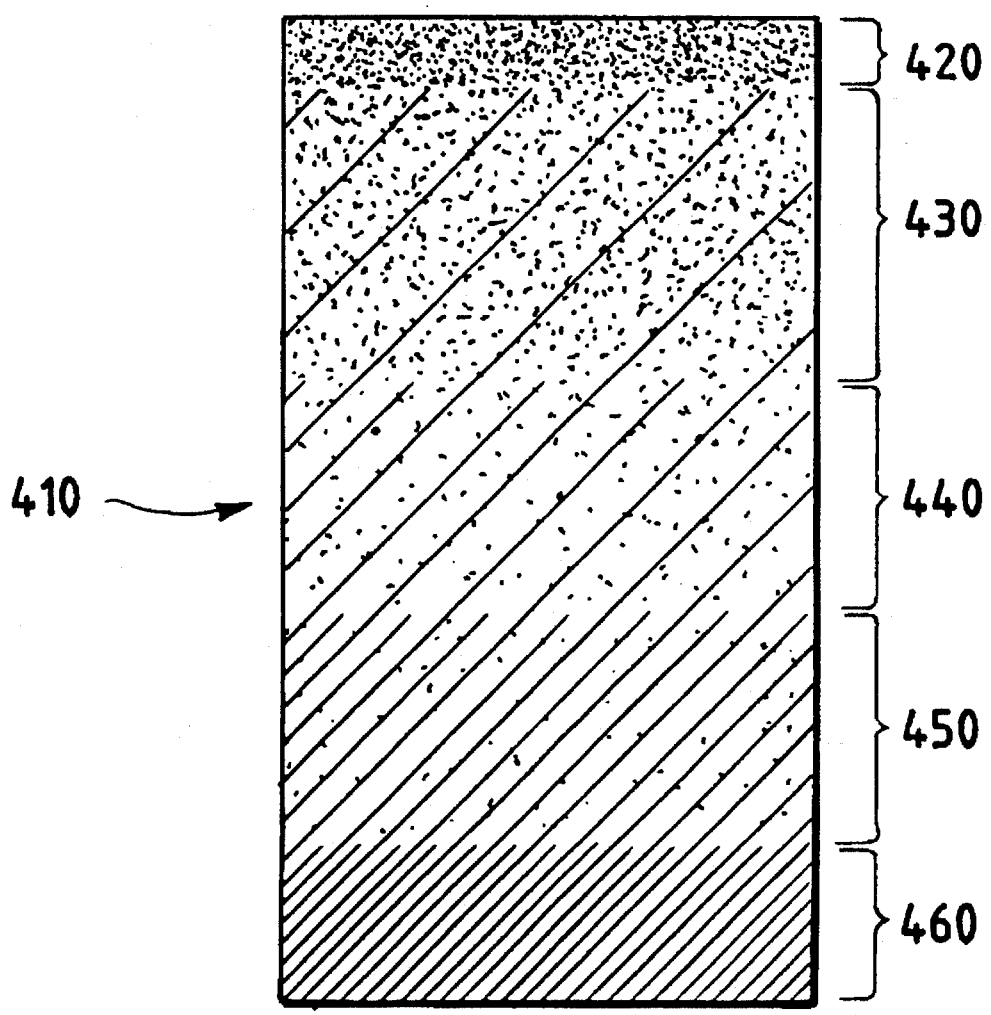
FIG. 1 illustrates a cross-section of an article produced according to one embodiment of the present invention.

The present invention is directed to a method for making ceramic-metal composites with continuous and interconnecting ceramic and metal phases, wherein the composite has at least two portions having different ceramic to metal ratios. The composite is formed by infiltrating molten metal into a sintered ceramic body having a substantially interconnected continuous pore structure wherein a portion of the sintered ceramic body has open porosity that is substantially different than the open porosity in another portion of the body.

According to the present invention, the ceramic matrix material is selected to be compatible with the infiltrant metal. That is, it is preferred that the ceramic matrix is capable of being wetted and infiltrated by the molten metal without the use of substantial overpressure. It is more preferred that, at the temperature of infiltration, the ceramic matrix is wet by the molten metal. Complete wetting of the ceramic matrix by the molten metal will enhance the spontaneous infiltration of the metal into the ceramic matrix without the use of substantial overpressure to force the metal into the ceramic matrix.

The ceramic matrix is a sintered matrix that comprises a substantially continuous ceramic phase. Among the preferred ceramic matrix materials are the sintered ceramic oxides, carbides and nitrides. In a preferred embodiment, a sintered oxide ceramic is selected from the group of alumina ($Al_2O_3$), aluminum titanate ($Al_2TiO_5$), nickel oxide (NiO), or magnesium oxide (MgO) ceramic. In addition to the primary ceramic oxide, the sintered ceramic can include other materials, such as sintering aids (e.g., $SiO_2$). Sintered aluminum titanate, for example, can also include additives, such as $SiO_2$ or $Fe_2O_3$ which can be added to aluminum titanate as stabilizers. In addition to the above-described oxides, non-oxide ceramics such as silicon carbide (SiC) or silicon nitride ($Si_3N_4$) can be used in some applications.

The ceramic matrix is a sintered matrix that has a substantially continuous ceramic phase. The sintered ceramic preferably has an identifiable shape and a free-standing form in the absence of constraining supports. This is to be distinguished from a vessel filled with loose or lightly packed particles or fibers of material. One of the advantages of using a cohesive sintered ceramic matrix is that the cohesive sintered ceramic matrix can be prefabricated into the shape of a selected article of manufacture (a preform). Further, the cohesive sintered ceramic matrix can be gripped by one portion (e.g., the top portion) while another portion of the matrix (e.g., a bottom portion) is contacted with the molten metal. The molten metal will then infiltrate by capillary action into substantially all of the open porosity of the ceramic, including those portions not immersed in the molten metal.

According to the present invention, the sintered ceramic matrix includes at least two portions wherein at least one of the portions has open porosity that is different than at least one other portion. For example, the sintered ceramic matrix can include 2 distinct portions wherein one portion has an open porosity that is at least about 10 percent different than the other portion. The change in porosity can be abrupt or gradual. In one embodiment, one of the portions includes substantially dense (i.e., 95 percent dense or higher) ceramic portion.

The ceramic matrix material is a sintered, coherent body that has an open and substantially continuous pore structure to facilitate the infiltration of molten metal into the matrix without the use of any substantial overpressure to force the metal into the matrix. As used herein, the term "substantial overpressure" refers to pressure in excess of about 3 atmospheres (about 45 psi) applied during the infiltration process, either mechanically or through pressurized gas.

The total open porosity in the portion of the ceramic matrix that is to be infiltrated must be at least about 5 volume percent, and is preferably from about 10 volume percent to about 90 volume percent. More preferably, the open porosity is from about 15 volume percent to about 80 volume percent of the sintered ceramic matrix. The average pore size of the open porosity is preferably from about 1 micrometer to about 10 micrometers, however, it is not believed that the average pore size is critical to the practice of the present invention. Porous ceramics having open and continuous porosity as described above can be formed in a number of ways.

For example, a green body comprising a ceramic powder can be formed and sintered in an enhanced vapor phase sintering process to form a porous body having a substantially continuous and interconnected pore structure. The total porosity and average pore size of the sintered ceramic matrix can be controlled by controlling the porosity of the green body and the sintering conditions. Vapor phase sintering is a convenient process to produce porous ceramics having controlled porosities and pore sizes. As such, the porous ceramics form suitable matrices for infiltration with molten metals to produce ceramic-metal composites having interpenetrating three-dimensional structures.

In the vapor phase sintering process, a green body is formed from ceramic powder. The starting particle size is not critical to the practice of the present invention, however, a smaller average particle size can be used to produce a sintered body having a lower average pore size.

It may be desirable to form agglomerates of the powder as a means of controlling the porosity of the green body formed from the powder. For example, aluminum hydroxide ($Al(OH)_3$) or aluminum sulfate ($Al_2(SO_4)_3$) particles having a diameter of about 50 micrometers can be calcined to form alumina agglomerates that have a porosity of about 50 volume percent. If these agglomerates are then formed into a body with about 50 volume percent packing, the net result will be about 75 volume percent porosity. The agglomerates can also be formed with additional powder to produce green bodies with a wider range of porosity than can be obtained with milled powder alone.

After ceramic powder having a desired particle size range has been obtained, the powder can be formed into a green body. As used herein, the term green body refers to an unsintered body of ceramic powder.

For example, the powder can be uniaxially pressed into a green body at a pressure of from about 48 MPa to about 69 MPa (7 ksi to 10 ksi) or isostatically pressed at similar pressures. In addition, forming additives can be used to improve the mechanical strength of the green body formed by pressing the ceramic powder. Additives can include binders such as polyvinyl alcohol, plasticizers such as polyethylene glycol, and lubricants such as aluminum stearate.

Other forming methods such as injection molding, extrusion, slip casting and similar processes can be used to form green bodies according to the present invention. Such methods are particularly advantageous when the sintered ceramic matrix will be a preform of complex shape that is to be infiltrated with a molten metal. Techniques such as injection molding are useful for fabricating articles having intricate and complex structures having a near-net shape.

Further, some green bodies with high levels of forming additives may have sufficient strength to enable the green body to be machined. Thus, intricate parts may advantageously be formed by machining processes while the piece is in the soft green state.

One method for controlling the total porosity of the sintered ceramic matrix formed by vapor phase sintering is to control the total porosity of the green body. This can be done, for example, by varying the pressing pressure. Typically, green bodies formed by uniaxially pressing finely-divided ceramic powder have porosities ranging from about 50 volume percent to about 65 volume percent. The total porosity can be increased to from about 70 volume percent to about 80 volume percent by using agglomerated powder, as is discussed hereinabove.

After forming, the green body can be sintered to obtain a sintered ceramic body. If organic binders or other organic materials are used in the green body forming process, these additives can advantageously be removed prior to fully sintering the ceramic powder. This is commonly referred to as "binder burnout." For example, the green body can be placed in a furnace and slowly heated to a temperature of, for example, about 600° C. to volatilize organic additives. Since these organic additives comprise a large amount of carbon, it is usually preferable to volatilize these materials under a flowing gas such as oxygen.

The green body can be presintered prior to vapor phase sintering. Presintering is a convenient and economical method of controlling the total porosity of the final sintered body. Presintering conveniently lowers the porosity of the green body to a range that is desirable for the sintered body, since the vapor phase sintering technique does not substantially affect the total porosity of the sintered body.

Preferably, the presintering step is done at a temperature that is slightly below the normal solid-state sintering temperature of the ceramic material. For example, alumina can be presintered at a temperature of from about 1300° C. to about 1600° C., more preferably from about 1450° C. to about 1550° C. The optimum temperature and sintering time will depend on the particle size of the starting powder or agglomerates. The sintering atmosphere is not critical and, therefore, air is preferred. However, certain atmospheres may be undesirable due to reactions between the atmosphere and the ceramic material at the presintering temperature. The presintering step preferably produces a presintered body having a total porosity of from about 10% to about 70%. The total porosity can be controlled by varying the time at the presintering temperature, such as from about 1 minute to about 300 minutes. The presintering step can determine the total porosity of the final sintered body, however, presintering may not be necessary if the green body has the desired total porosity for the final sintered product. The presintered body may advantageously be machined to its appropriate final shape and dimensions.

The presintered or green ceramic body is then vapor phase sintered to maintain control over the total porosity and average pore size of the sintered body and form a porous sintered ceramic.

Enhanced vapor phase sintering has been studied for some ceramic materials. According to this process, volatile transport gases at a high partial pressure are produced during sintering. Preferably, the partial pressure of the transport gas is at least about $10^{-4}$ atm at the sintering temperature and more preferably at least about $10^{-3}$ atm. It has been found that for some ceramic materials, the vapor phase sintering process may be enhanced by the presence of a reaction gas or a material that produces such a gas, particularly a gas comprising a halide, in the sintering atmosphere. For example, vapor phase sintering of magnesia can be enhanced by the addition of hydrogen chloride (HCl) gas:

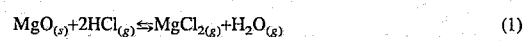

$$MgO_{(s)} + 2HCl_{(g)} \rightleftharpoons MgCl_{2(g)} + H_2O_{(g)} \quad (1)$$

In one embodiment of the present invention, an alumina-containing body is sintered in the presence of hydrogen chloride gas (HCl), thereby promoting the reaction:

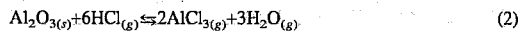

$$Al_2O_{3(s)} + 6HCl_{(g)} \rightleftharpoons 2AlCl_{3(g)} + 3H_2O_{(g)} \quad (2)$$

Alternatively, alumina may be sintered in the presence of hydrogen fluoride gas (HF) in which case the vapor phase transport occurs primarily via the process:

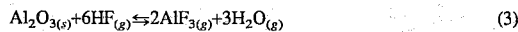

$$Al_2O_{3(s)} + 6HF_{(g)} \rightleftharpoons 2AlF_{3(g)} + 3H_2O_{(g)} \quad (3)$$

The reaction gas (e.g., HCl or HF) can be added to the sintering furnace directly in the form of commercially available bottled gas. In this embodiment, the gas should be dry and contain minimal residual moisture. Residual water ($H_2O$) can drive the reverse reaction and inhibit formation of the vapor transport species. Preferably, the partial pressure of the reaction gas is at least about 0.25 atm and is more preferably from about 0.4 atm to about 1 atm.

Alternatively, the gas may be formed in-situ within the sintering furnace. For example, aluminum fluoride ($AlF_3$) powder can be placed in a closed furnace. As the furnace is heated, hydrogen gas is added to the furnace to promote an insitu reaction to form hydrogen fluoride gas over the alumina. This procedure is particularly advantageous when environmentally difficult gases such as hydrogen fluoride are used.

Sintering temperatures can vary depending on the ceramic material being sintered. For example, alumina powder is preferably sintered at a temperature from about 1400° C. to about 1600° C. to form a sintered ceramic body. The pore size and pore size distribution can be controlled by adjusting the amount of time that the body is sintered at the sintering temperatures. Table 1 lists the mean pore diameter for alumina compacts sintered at 1600° C. for varying amounts of time under 1 atm HCl. For each sample, the starting particle size was 1 micrometer and the porosity of the sample remained at about 50 volume percent regardless of the sintering time.

TABLE 1

| TIME | MEAN PORE SIZE |
|---|---|
| 10 min. | 2.1 microns |
| 80 min. | 3 microns |
| 250 min. | 4 microns |
| 1080 min. | 7.5 microns |

As Table 1 illustrates, as the sintering time increases, the average pore diameter also increases. However, the total porosity remains substantially constant.

The ceramic body may be sintered in any system in which the partial pressure of the reaction gas, and hence the transporting gas can be controlled. For example, a simple tube furnace having a sealed end with an inlet for the reaction gas may be used.

As an alternative to vapor phase sintering, it is known to those skilled in the art that the open porosity of a ceramic can be controlled by controlling variables such as the starting particle size of the ceramic powder, the composition of the ceramic powder and/or the sintering temperature. Specifically, ceramic powder having a larger average particle size, the absence of sintering aids in the composition and lower sintering temperatures can all produce a sintered ceramic body having open porosity.

For example, porous sintered alumina can be formed from alumina particles having an average particle size in the range of from about 0.5 micrometers to about 70 micrometers by forming the particles into a green body and sintering. The green body can be sintered at a temperature of from about 900° C. to about 1800° C. to form a porous sintered ceramic if the sintering temperature is somewhat below the normal sintering temperature for obtaining dense alumina. The absence of sintering aids, such as silica, will also increase the porosity of the ceramic.

Other methods for forming porous ceramics include the use of pore formers. Pore formers are materials which have a volatilization temperature that is lower than the sintering temperature of the ceramic. Thus, materials such as walnut shells or latex spheres can be added to the ceramic mix. Upon sintering, the material volatilizes, leaving behind open pore space. For example, aluminum titanate porous bodies can be produced by using pore formers, particularly walnut shells.

According to one aspect of the present invention, the sintered ceramic matrix material has a porosity gradient. That is, the porous ceramic matrix has regions of different porosity. For example, one portion of the ceramic matrix can be substantially 100 percent dense (e.g. 95 percent dense or higher) while another portion can have a high open porosity, for example about 60 volume percent or greater. When the porous portion is contacted with molten metal, the metal will infiltrate throughout the ceramic porosity, resulting in an article having a dense ceramic portion and a composite portion. The porosity gradient may be a gradual through the material or it may include one or more abrupt changes in porosity, such as a ceramic matrix formed by layers of material having different porosity characteristics. The advantages of a gradient composite material can include the alleviation of the effects of an abrupt thermal expansion gradient, the ability to attach the composite to a variety of materials and the ability to have an article with a dense ceramic surface intimately attached to a composite surface.

According to the present invention, a ceramic matrix having portions of different porosity can be formed by a number of techniques. For example, a dry press cavity can be sequentially filled with ceramic powder having different particle sizes to produce a layered structure. Upon pressing and sintering of the ceramic particles, the resulting sintered body will have a porosity gradient. Alternatively, a sintered ceramic body having a homogenous particle size distribution can be sintered in a temperature gradient to produce a ceramic body having varying levels of porosity. Alternatively, ceramic bodies can be slip-cast in multiple steps using ceramic slurries having different particle sizes to produce a slip-cast and sintered ceramic having a gradient porosity. Further, pore formers, as described above, can be distributed throughout the ceramic green body in a manner such that when the pore formers volatilize, leaving behind open porosity, the amount of open porosity will be different throughout the ceramic. Therefore, when the sintered ceramic formed by a process as described above or similar processes is infiltrated with metal, the ratio of ceramic to metal throughout the composite will change, either gradually or abruptly.

As discussed above, it is preferable to obtain a ceramic matrix for infiltrastion having an open porosity that is at least about 5 volume percent, preferably from about 10 volume percent to about 90 volume percent, and more preferably from about 15 volume percent to about 80 volume percent open porosity. The open porosity preferably has an average pore size of at least about 1 micrometer and more preferably from about 1 micrometer to about 10 micrometers.

When a porous ceramic matrix having the desired total porosity, pore size and shape is obtained, molten metal can be infiltrated into the open porosity of the ceramic matrix. In a preferred embodiment of the present invention, the ceramic matrix is brought into contact with the molten metal and the metal infiltrates the ceramic matrix by capillary action without the assistance of substantial overpressure. Thus, when contacted with the sintered ceramic, the molten metal enters the pore structure of the ceramic and fills substantially all of the open porosity or a selected portion of the open porosity.

According to a preferred embodiment of the present invention, the sintered ceramic body is contacted with the top surface of a molten pool of infiltrant metal for a time sufficient to infiltrate at least a portion of the sintered ceramic body. According to this embodiment, the infiltrant metal is placed in a refractory vessel and is heated to a temperature in excess of the melting temperature of the metal such that the metal is in the form of a molten pool having a top surface. Preferably, the metal is heated to a temperature that is sufficiently high to melt all constituents of the alloy and is high enough to yield a liquid metal with a low enough viscosity to permit infiltration in the absence of substantial overpressure. For example, if oxygen is used as an infiltration additive, the temperature of the molten metal should be above the melting point of copper oxide, e.g., at least about 1230° C.

The sintered ceramic body is brought into contact with the molten pool and the molten metal infiltrates the open porosity of the ceramic and substantially fills the open porosity. The metal-infiltrated ceramic is then cooled to form the ceramic-metal composite having substantially continuous metal and ceramic phases.

The pool of molten metal infiltrates the ceramic by capillary action which overcomes the forces of gravity and pulls the molten metal into the ceramic matrix. The advantage of using such a process is that the molten metal infiltrates the ceramic structure and no excess metal will flow out of the ceramic structure. Further, since capillary action is the driving mechanism for infiltrating the metal into the ceramic structure, the metal will infiltrate substantially all portions of the ceramic structure, regardless of the shape of the structure, without having to completely immerse the matrix into the molten metal. Further, the infiltrating metal can force out gas as the metal infiltrates so that little or no gas is trapped in the composite.

An embodiment of this method is illustrated in FIGS. 2A, 2B, 3A and 3B. Referring to FIGS. 2A and 2B, a ceramic tube 205 is provided having a lower end 210 that is closed and an upper end 215 that is open. The open upper end 215 is sealed, such as by using a teflon seal 220. A gas inlet/outlet 225 is provided such that gases can be extracted from or purged into the ceramic tube 205.

A ceramic control rod 230 extends through the seal 220 and is attached to a sintered ceramic body 235 having open and substantially continuous porosity. In this embodiment, the sintered ceramic body 235 includes an upper portion 260 that is substantially 100 percent dense ceramic and a lower portion 265 that has substantially continuous and open porosity. The control rod 230 can be raised or lowered to control the vertical position of the sintered ceramic body 235 within the ceramic tube 205.

The lower end 210 of the ceramic tube 205 contains a refractory vessel 240. The lower end 210 is placed in a "hot zone" wherein heating means (not illustrated) can heat the lower end 210 to elevated temperatures. The refractory vessel 240 contains a quantity of molten metal 245 having an upper surface 250. Thus, the sintered ceramic body 235 can be lowered by the control rod 230 such that at least a portion of the sintered ceramic body 235 contacts the upper surface 250 of the molten metal 245.

Referring to FIGS. 3A and 3B, the hot zone is heated to a temperature of at least the melting temperature of the molten metal 245. Preferably, the sintered ceramic body 235 is in the hot zone for a sufficient amount of time that the sintered ceramic body 235 is heated to at least the melting temperature of the molten metal 245. A portion of the sintered ceramic body 235 integral with the lower portion 265 having substantially continuous and open porosity, is contacted with the top surface 250 of the molten metal 245.

The molten metal 245 then infiltrates the lower portion 265 of the sintered ceramic body 235. Thus, a ceramic-metal composite 255 is formed wherein a top portion 260 includes a substantially dense ceramic and a bottom portion 265 comprises a ceramic-metal composite.

Preferably, the amount of molten metal 245 available in the refractory vessel 240 to infiltrate the sintered ceramic body 235 is sufficient in quantity such that the sintered ceramic body 235 completely infiltrates without the top surface 250 lowering to a point below the portion of the sintered ceramic body 235 that is in contact with the molten metal 245.

The method according to this embodiment of the present invention also permits the composite to be formed in a very quick and efficient manner. For example, the infiltration time typically takes less than about 1 hour, preferably takes less than about 15 minutes and more preferably takes less than about 1 minute. A 0.75 inch diameter cylinder of porous alumina can be infiltrated to a depth of about 3 inches by copper metal in less than about 1 minute.

It is also preferable to heat the ceramic to at least about the temperature of the molten metal. This is desirable since, if the ceramic is substantially cooler, the metal may cool and solidify upon infiltrating and contacting the ceramic matrix and thereby prevent further infiltration of the ceramic matrix by the metal.

The amount of infiltration into the ceramic matrix can be controlled by controlling the amount of time that the matrix is in contact with the molten metal. The desired amount of time will depend upon the ceramic matrix and metal being infiltrated, and the specific amount of time to infiltrate to a specific degree can be determined by routine experimentation.

Although the present invention is applicable to many combinations of matrix and infiltrant metals, it has been found particularly applicable to certain ceramic-metal composites. For example, in one preferred embodiment, copper is the infiltrant metal. As used herein, the term "copper metal" refers to any metal alloy that is predominantly copper, i.e., at least about 50% copper. Copper can be alloyed with a number of other elements, and in certain preferred embodiments discussed in detail below, copper can be alloyed with oxygen or titanium. Copper can also be alloyed with zinc or tin to form brass or bronze, respectively.

According to one preferred embodiment, the copper is infiltrated into a ceramic body that comprises a sintered ceramic oxide selected from the group of alumina, aluminum titanate, magnesium oxide and nickel oxide. In a more preferred embodiment, the ceramic matrix is alumina. Copper infiltrated alumina can advantageously provide high conductivity along with good hardness and strength provided by the ceramic matrix.

To improve the capillary action between the ceramic and the molten metal, it may be desirable to modify the wetting or spreading characteristics of the ceramic and metal. One way to do this is to coat the open porosity of the ceramic with a coating that is more easily wet by the molten metal. For instance, the interior surfaces of a sintered alumina ceramic can be modified by vapor phase coating, such as by chemical vapor deposition (CVD), the ceramic with copper oxide or nickel oxide to enhance the infiltration of copper metal.

Another way of enhancing the wetting characteristics is to modify the chemical composition of the molten metal with an infiltration additive. For instance, the wetting of molten copper on alumina can be enhanced by the addition of oxygen to the copper or with the addition of titanium (Ti). Such additions enhance the wetting and permit infiltration to occur rapidly and easily. When oxygen is added, it is preferred to add the oxygen to the copper metal in an amount of from about 1.5 weight percent to about 10 weight percent, more preferably from about 2 weight percent to about 5 weight percent. When titanium is used as an infiltration additive, it is preferably added in an amount of from about 1 weight percent to about 10 weight percent.

After one or more of the surface modifications and chemical alterations noted above, if necessary, the molten metal will wet the ceramic and infiltrate substantially all of the void space of the ceramic through capillary action.

In a preferred embodiment, the metal infiltration step is performed in a vacuum atmosphere. As used herein, vacuum atmosphere refers to an atmospheric pressure of about 10 millitorr or less. The evacuation of air from the ceramic void space reduces the likelihood that air pockets will be entrapped in the composite.

The ceramic-metal composites produced by the present invention have relatively high strengths and toughness. In one embodiment, a composite comprising about 65% alumina and about 35% copper/copper oxide has a compressive strength of at least about 110 ksi.

According to one aspect of the present invention, the ceramic matrix includes at least two portions wherein one of the portions has a porosity that is substantially different than another portion. As used herein, the term "substantially different" means having a porosity that is at least about 10 volume percent different that the porosity in the second portion of the ceramic.

As illustrated in FIG. 1, the composite can have a gradually changing ratio of metal to ceramic. Thus, FIG. 1 illustrates a composite according to this aspect of the invention. The composite is formed substantially by the process described with reference to FIGS. 2 and 3. The composite 410 includes an upper portion 420 that consists essentially of dense ceramic. The dense ceramic has a density of at least about 95% and preferably has a density approaching 100% of the theoretical density of the ceramic. Directly below the upper portion 420 is a second portion 430. For example, this portion can have from about 5 volume percent to about 30 volume percent metal based on the total volume of the portion 430. Directly below this portion is a third portion 440. The third portion 440 has, for example, from about 30 volume percent to about 70 volume percent metal based on the total volume of the portion. Below this portion is a fourth portion 450 having from about 70 volume percent to about 90 volume percent metal infiltrated into the ceramic.

In this embodiment, the composite includes a bottom portion 460 that consists essentially of a metal. This metal portion 460 can be formed by infiltrating the ceramic in a mold containing molten metal and permitting the metal to cool in the mold.

The ceramic-metal composites produced according to the present invention are particularly useful as materials for high temperature applications where creep resistance and high toughness are needed. For example, in automotive components such as valves, exhaust port liners, and seal faces, turbine blades, turbocharger rotors, electrical contacts, armor, boiler tubes, and the like. The composites according to this invention can be particularly useful for joining two different materials, such as a dense ceramic to a metal or a ceramic-metal composite.

EXAMPLE 1

An alumina powder (CERALOX HPA, Ceralox Corp., Tucson, Ariz.) is obtained having an average particle size of about 1.0 micrometers. The alumina powder is formed into a green body by uniaxially pressing the powder at a pressure of about 50 MPa to obtain a green body having a porosity of about 55 volume percent.

The green body is then presintered in air at a temperature of about 1500° C. for about 3 minutes. The presintered body has a porosity of about 35 volume percent.

The presintered body is then placed in a sintering furnace that comprises an alumina tube. The temperature of the furnace is raised as the furnace is evacuated. Before reaching about 800° C., the furnace is purged with argon gas to remove impurities in the furnace atmosphere. At about 800° C., the furnace is filled with HCl gas having a pressure of about 1 atm. The alumina body is then sintered under HCl gas at a temperature of about 1600° C. for about 80 minutes.

The sintered alumina ceramic has a total porosity of about 35 volume percent and has an average pore size of about 3 micrometers. The alumina forms a continuous three-dimensional structure and there is substantially no closed porosity.

The sintered alumina ceramic is placed in a furnace and heated to about 1275° C. and is contacted with a molten copper bath containing about 3 weight percent oxygen at a temperature of about 1275° C. The bottom surface of the alumina ceramic is contacted with the molten metal and the molten metal infiltrates through the entire alumina matrix by capillary action. The composite is then cooled. The composite comprises about 65 volume percent of a substantially continuous alumina phase and about 35 volume percent copper/copper oxide as a substantially continuous phase. The composite has a compressive strength of about 112 ksi.

EXAMPLE 2

To demonstrate the feasibility of infiltrating copper into aluminum titanate, two disks of a porous aluminum titanate were obtained. The aluminum titanate disks had a porosity of about 20 volume percent and about 70 volume percent. Copper metal was contacted with the aluminum titanate disks and the assemblies were heated to about 1300° C. in air and substantially complete infiltration occurred in about 20 minutes. Copper metal infiltrated the aluminum titanate and contained about 4.5 weight percent oxygen. The composite can be heated in a reducing atmosphere to reduce the residual copper oxide to copper.

EXAMPLE 3

Reaction bonded silicon nitride was infiltrated with 99.5 percent pure aluminum. Aluminum was contacted with a reaction bonded silicon nitride body and the assembly was heated in a vacuum furnace at 1100° C. for 60 minutes. A portion of the porous silicon nitride was infiltrated with aluminum. There was some fracture of the composite portion from the silicon nitride body due to the thermal expansion mismatch.

EXAMPLE 4

This example illustrates the infiltration of silicon nitride with a nickel-titanium alloy. A nickel-titanium alloy containing 10 weight percent titanium was place to contact with a silicon nitride body and was heated in a vacuum furnace to a temperature of 1400° C. with a partial pressure of oxygen of about $10^{-8}$ atmospheres. The nickel-titanium alloy infiltrated the silicon nitride. Similar results were obtained by substituting chromium for the titanium.

EXAMPLE 5

Alumina was infiltrated with a silver-copper alloy composition including about 95 percent silver and about 5 percent copper/copper oxide. The advantage of this composite is that the silver maintains a high ductility within the composite.

EXAMPLE 6

Aluminum having a purity of 99.5 percent was infiltrated into reaction bonded silicon carbide having silicon metal as a second phase, The system was maintained at 1100° C. for 60 minutes to insure complete mixing in the liquid state.

While various embodiments of the present invention have been described in detail, it is apparent that modifications and adaptations of those embodiments will occur to those skilled in the art. However, it is to be expressly understood that such modifications and adaptations are within the spirit and scope of the present invention.

What is claimed is:

1. A method for making a ceramic-metal composite having graded properties, comprising the steps of:
    (a) forming a sintered ceramic body having a substantially continuous ceramic phrase and having at least two portions wherein at least one of said portions comprises a ceramic consisting essentially of alumina having open porosity that is substantially different than the open porosity in another portion of said ceramic body;
    (b) placing a metal consisting essentially of copper in a refractory vessel adapted to contain said metal in a molten state;
    (c) heating said metal to a temperature in excess of the melting temperature of said metal to form a molten pool of metal having a top surface;
    (d) contacting a portion of said sintered ceramic body with said molten pool of metal to spontaneously infiltrate said metal into said sintered ceramic body without the use of substantial overpressure to force said metal into said ceramic; and
    (e) cooling said infiltrated ceramic to form a ceramic-metal composite.

2. A method as recited in claim 1, wherein at least a portion of said composite comprises substantially fully dense ceramic.

3. A method as recited in claim 1, wherein said ceramic-metal composite is a piston for an internal-combustion engine having a top surface consisting essentially of a ceramic.

4. A method as recited in claim 1, wherein said at least two portions comprise a porosity gradient in said sintered ceramic body wherein the porosity gradient in said sintered ceramic changes substantially continuously from one end to another.

5. A method as recited in claim 1, wherein said two portions have at least about 10 percent difference in the volume percent of open porosity.

6. A method for making an article having a ceramic-metal composite portion integrally connected to a dense ceramic portion, comprising the steps of:
    (a) forming a cohesive sintered ceramic body having at least a top portion consisting essentially of dense ceramic and a bottom portion comprising a substantially continuous ceramic matrix having at least about 5 volume percent open porosity;
    (b) placing an infiltrant metal into a refractory vessel adapted to contain said metal at high temperatures;

(c) heating said metal to a temperature in excess of the melting temperature of said metal such that said metal is in the form of a molten pool having a top surface;

(d) contacting said bottom portion of said sintered ceramic body with said top surface of said molten pool without the use of substantial overpressure for a time sufficient to spontaneously infiltrate at least a portion of said open porosity of said sintered ceramic body with said metal;

(e) removing said sintered ceramic body from contact with said molten pool; and (f) cooling said metal-infiltrated ceramic to form an article having a ceramic-metal composite portion integrally connected to a dense ceramic portion, wherein the ceramic-metal composite portion comprises a substantially continuous metal phase.

7. A method as recited in claim 6, wherein said bottom portion comprises from about 10 volume percent to about 90 volume percent open porosity.

8. A method as recited in claim 6, wherein said metal is copper metal.

9. A method for making a ceramic-metal composite article, comprising the steps of:

(a) forming a ceramic powder into a green body;

(b) sintering said green body at a temperature for a time to form a sintered ceramic body having a substantially continuous ceramic phase and having at least two portions wherein at least one of said portions comprises ceramic having open porosity that is substantially different than the open porosity in another portion of said ceramic body;

(c) contacting said sintered ceramic body with a molten metal to spontaneously infiltrate said metal into said ceramic body without the use of substantial overpressure to force said metal into said ceramic body; and (d) cooling said infiltrated ceramic to form a ceramic-metal composite comprising a substantially continuous metal phase.

10. A method as recited in claim 9, wherein said sintering step comprises the step of vapor-phase sintering.

11. A method as recited in claim 9, wherein said ceramic-metal composite consists essentially of a substantially continuous ceramic phase and a substantially continuous metal phase.

* * * * *